United States Patent [19]
Leighton et al.

[11] Patent Number: 5,821,148
[45] Date of Patent: Oct. 13, 1998

[54] METHOD OF FABRICATING A SEGMENTED EMITTER LOW NOISE TRANSISTOR

[75] Inventors: John Leighton, Anoka; John Shier, Apple Valley, both of Minn.

[73] Assignee: VTC Inc., Bloomington, Minn.

[21] Appl. No.: 678,971

[22] Filed: Jul. 12, 1996

Related U.S. Application Data

[62] Division of Ser. No. 484,675, Jun. 7, 1995.

[51] Int. Cl.⁶ .................................................. H01L 21/331
[52] U.S. Cl. ......................... 438/309; 438/369; 438/370; 257/560; 257/563; 257/578; 257/579
[58] Field of Search ..................................... 257/579, 560, 257/563, 578, 584, 141, 144; 148/DIG. 10, 11; 438/309, 369, 370

[56] References Cited

U.S. PATENT DOCUMENTS

| | | | |
|---|---|---|---|
| 3,252,063 | 5/1966 | Ziffer | 317/235 |
| 3,444,443 | 5/1969 | Moroshima | 317/235 |
| 3,704,398 | 11/1972 | Fukino | 317/235 |
| 3,762,966 | 10/1973 | Engeler et al. | 148/175 |
| 3,911,470 | 10/1975 | Ruegg | 357/36 |
| 3,938,176 | 2/1976 | Sloan, Jr. | 357/49 |
| 3,995,304 | 11/1976 | Pease | 357/36 |
| 4,291,319 | 9/1981 | Carinalli | 357/13 |
| 4,291,324 | 9/1981 | Kessler, Jr. et al. | 357/36 |
| 4,306,246 | 12/1981 | Davies et al. | 357/36 |
| 5,296,732 | 3/1994 | Iwata et al. | 257/565 |

FOREIGN PATENT DOCUMENTS

| | | | |
|---|---|---|---|
| 358188159 | 11/1983 | Japan | 257/578 |
| 000172327 | 2/1986 | Japan | 257/578 |
| 362026855 | 2/1987 | Japan | 257/563 |
| 362119973 | 6/1987 | Japan | 257/584 |
| 401232742 | 9/1989 | Japan | 257/563 |

*Primary Examiner*—John Niebling
*Assistant Examiner*—Long Pham
*Attorney, Agent, or Firm*—Kinney & Lange, P.A.

[57] ABSTRACT

The present invention implements a novel emitter scheme that maximizes the emitter perimeter to emitter area ratio of an integrated circuit transistor, thereby achieving improved low noise characteristics over the prior art. Emitter regions are disposed in the transistor in discrete "dotted" segments. The dotted emitter segments may be realized by etching into emitter regions defined by an appropriately formed photoresistive overlay, which can be modified without fabrication process changes. The effect is to reduce the total emitter area by half, while maintaining the total emitter perimeter unchanged. As a result, the noise-capacitance product of the transistor is reduced, improving the overall performance of the transistor.

4 Claims, 11 Drawing Sheets

METHOD OF FABRICATING A SEGMENTED EMITTER LOW NOISE TRANSISTOR

This is a divisional of application Ser. No. 08/484,675, filed Jun. 7, 1995.

BACKGROUND OF THE INVENTION

The present invention relates generally to low noise transistors and more particularly to an improved low noise transistor having segmented emitter features to decrease the noise-capacitance product associated with the transistor, thereby enhancing transistor performance.

Transistors are utilized in a variety of applications in the modern electronics industry. As the level of sophistication has increased in the electronics field, so has the need for extremely accurate and precise components. One characteristic that limits the precision of an electronic circuit's performance is the noise associated with transistors implemented in the circuit. In particular, transistor noise limits accuracy of sensing small voltage signals, which is extremely important in applications such as data storage and retrieval. For example, the lower the bit error rate is for a disc drive reader, the more tightly the bits can be packed onto the storage medium, which leads to greater storage capacity. The bit error rate is often directly related to the noise associated with the transistors in the read circuit, which is used to read very low voltage signals, for example a few hundred microvolts peak to peak.

One of the primary sources of noise in an integrated circuit transistor is often the pinched base resistance. The resistance in the pinched base region, which is the region of the base located directly under the emitter region where the base region becomes pinched, can be many times larger than the resistance of the rest of the base region. Therefore, minimizing the pinched base resistance has been one of the primary objectives in producing a low noise transistor. One design technique utilized in the past has been manufacturing low noise transistors with alternating parallel base and emitter "stripes." Emitter stripes are long, narrow emitter regions within the base region, and have emitter contacts disposed on them. Base stripes are long, narrow base contacts disposed between the emitter stripes on the base region. The width of each emitter stripe has been made as narrow as possible, given practicable photolithographic resolution limits, in order to minimize the size of the pinched base region underneath the emitter stripe. The smaller each pinched base region, the less total pinched base resistance there is in the transistor.

A minimum stripe width also allows for the use of more emitter stripes in a given transistor space, which further reduces noise as more of the pinched base regions are in parallel, thereby reducing the effective pinched base resistance. Each emitter stripe acts as its own resistor, such that each stripe being parallel to each other, acts as a parallel resistor and reduces the total resistance of the system. However, once the manufacturable limit of stripe width has been reached, reduction of the pinched base resistance cannot be improved any further by the above-identified methods.

In addition, noise reduction has been accomplished at the expense of increased transistor size or increased capacitance, which is undesirable in a low noise transistor. In many applications, the capacitance allowed in a transistor is already determined by the application circuitry, and cannot be increased further. A good low noise transistor needs to have a minimized noise-capacitance product so that noise can be minimized for a predetermined capacitance. Capacitance is generally proportional to emitter area (a greater area results in a higher capacitance), while noise is generally governed by emitter perimeter (a greater emitter perimeter results in lower noise). These competing constraints must be intermatched in an optimum trade-off in order to create an improved low noise transistor.

Therefore, there is a need for an improved low noise transistor with a decreased noise capacitance product, and enhanced transistor performance.

SUMMARY OF THE INVENTION

The present invention implements a novel emitter scheme that maximizes the emitter perimeter to emitter area ratio of an integrated circuit transistor, thereby achieving improved low noise characteristics over the prior art. Emitter regions are disposed in the transistor in discrete "dotted" segments. In one embodiment, an emitter stripe of width W is simply replaced by a series of W by W dotted segments occupying the same general space that had been occupied by the stripe in the prior art transistor. These dotted emitter segments may be realized, for example, by etching into emitter regions defined by an appropriately formed photoresistive overlay, which can be modified without fabrication process changes. The effect is to reduce the total emitter area by half, while maintaining the total emitter perimeter unchanged. As a result, the noise-capacitance product of the transistor is reduced, improving the overall performance of the transistor.

In one form of the invention, the emitter regions are disposed in circular shaped segments. The shape of the emitter segments is selected to maximize the emitter perimeter to emitter area ratio of each individual emitter feature, in addition to the ratio for the entire transistor.

Various emitter layouts may be employed to optimize the emitter to base contact ratio, and produce the best achievable low noise transistor.

DETAILED DESCRIPTION OF THE PREFERRED EMBODIMENTS

Figure 1:
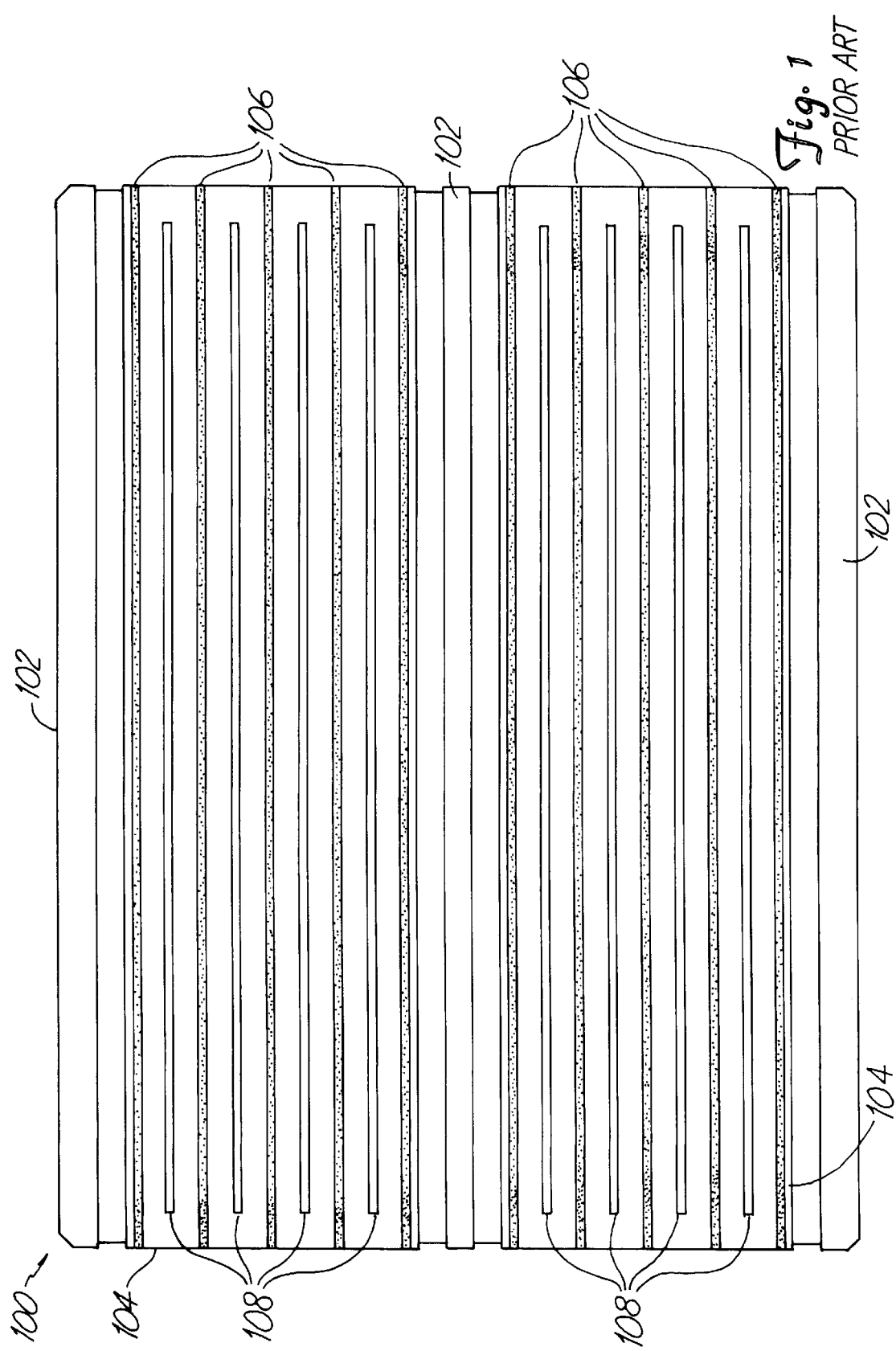
FIG. 1 is a top view of a prior art low noise transistor.

Referring to FIG. 1, a top view of prior art low noise transistor 100 is shown, having collector contact regions 102, base regions 104, base contact stripes 106, and emitter stripes 108. Emitter stripes 108 are made as narrow as possible, given current photolithographic limits, in order to reduce the pinched-base resistance, which is the resistance of base region 104 underneath emitter stripes 108. Pinched base resistance is often the dominant source of noise in transistor 100. The use of a large number of emitter stripes 108 also helps to reduce the noise associated with transistor 100, as more of the pinched base regions are in parallel, which reduces the effective overall pinched-base resistance. However, when the manufacturable limit of the width of emitter stripes 108 is reached, the noise characteristics of transistor 100 cannot be improved further utilizing prior art techniques. Using more or longer emitter stripes 108 increases the size and capacitance of the transistor 100, both of which are undesirable in a low noise transistor. The noise-capacitance product of transistor 100 is a critical parameter, which needs to be minimized for optimum performance in a predetermined capacitance application. This is generally done by maximizing the emitter perimeter to emitter area ratio in transistor 100. The emitter perimeter and emitter area refer to the perimeter and area of the emitter regions associated with each emitter stripe 108 The emitter perimeter is the sum of the perimeters of all emitter stripes 108.

Figure 2:
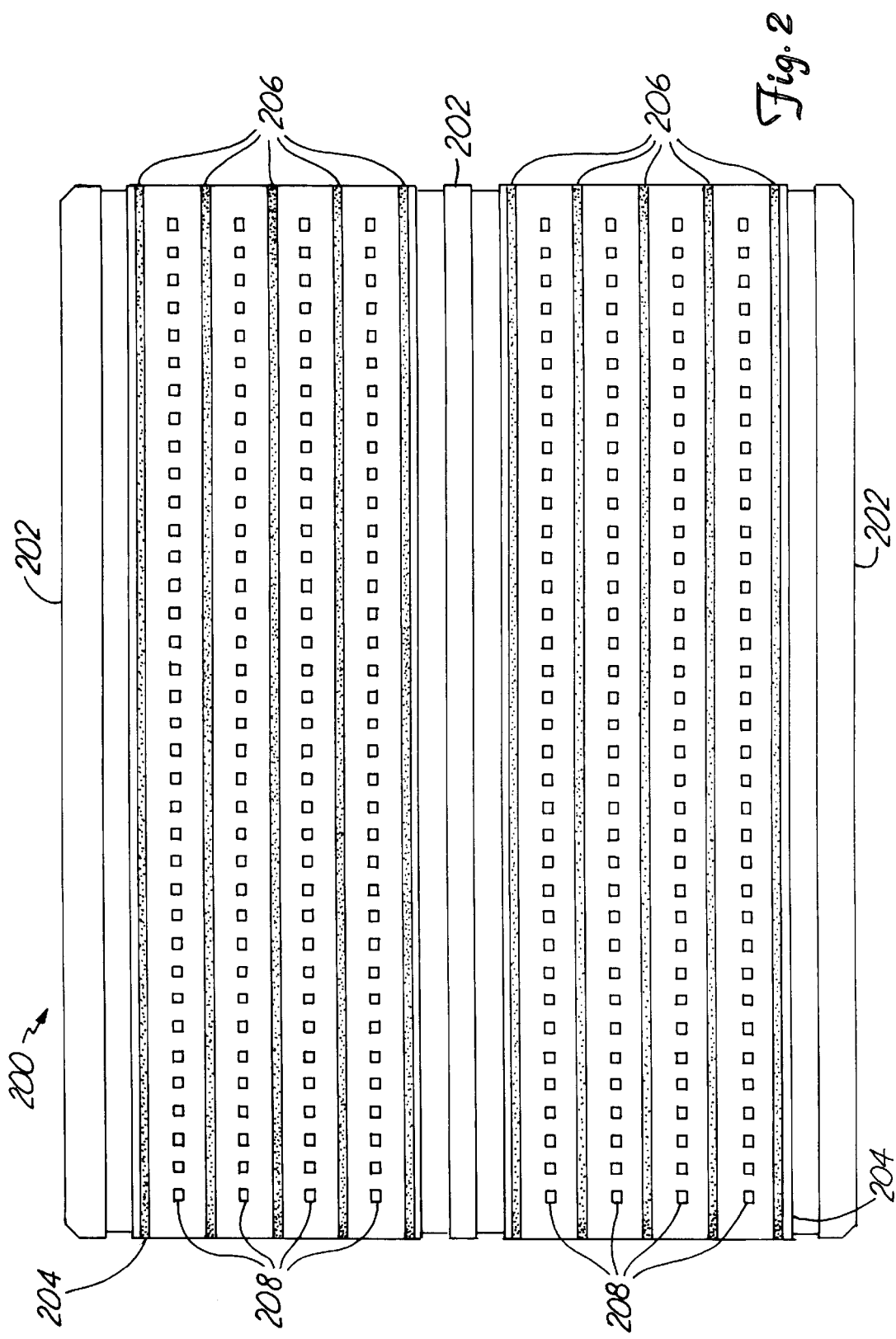
FIG. 2 is a top view of a low noise transistor according to the present invention.

FIG. 2 is a top view of low noise transistor 200 according to the present invention. Transistor 200 includes collector contact regions 202, base regions 204, base contact stripes 206, and rows of segmented or "dotted" emitter stripes 208. Similar to emitter stripes 108, each row of segmented emitter stripes 208 is made as narrow as possible in order to reduce pinched base resistance. By utilizing segmented emitter stripes 208 rather than continuous emitter stripes 108 (see FIG. 1), effective emitter area of transistor 200 is reduced by approximately half while the total emitter perimeter (which is the sum of the perimeter of each individual emitter segment 208) remains unchanged. Since the capacitance of a transistor is generally proportional to emitter area, and the noise of a transistor is generally inversely proportional to emitter perimeter, the emitter perimeter to emitter area ratio of transistor 200 is effectively doubled, resulting in an improved noise-capacitance product and improved performance.

In one embodiment, each individual emitter segment 208 is a square having side length equal to the minimum manufacturable width (W). In another embodiment, each emitter element 208 is a circle of diameter W, which maximizes the emitter perimeter to emitter area ratio of each individual emitter segment, helping to improve the overall noise-capacitance product of transistor 200. Maximizing the emitter perimeter of each individual emitter segment 208 maximizes the emitter perimeter of the transistor 200, since emitter perimeter is the sum of the perimeters of each emitter segment 208.

Segmented emitters 208 may be realized by etching into emitter regions defined by a photoresistive overlay (not shown) shaped according to the desired layout of emitter segments 208. Continuous emitter stripes 108 (see FIG. 1) are formed in the same way, and the only change in the fabrication sequence is to form the photoresistive overlay differently. No process changes are required by the present invention, and manufacturing costs are therefore not affected by implementing the improvement of the present invention.

Figure 3:
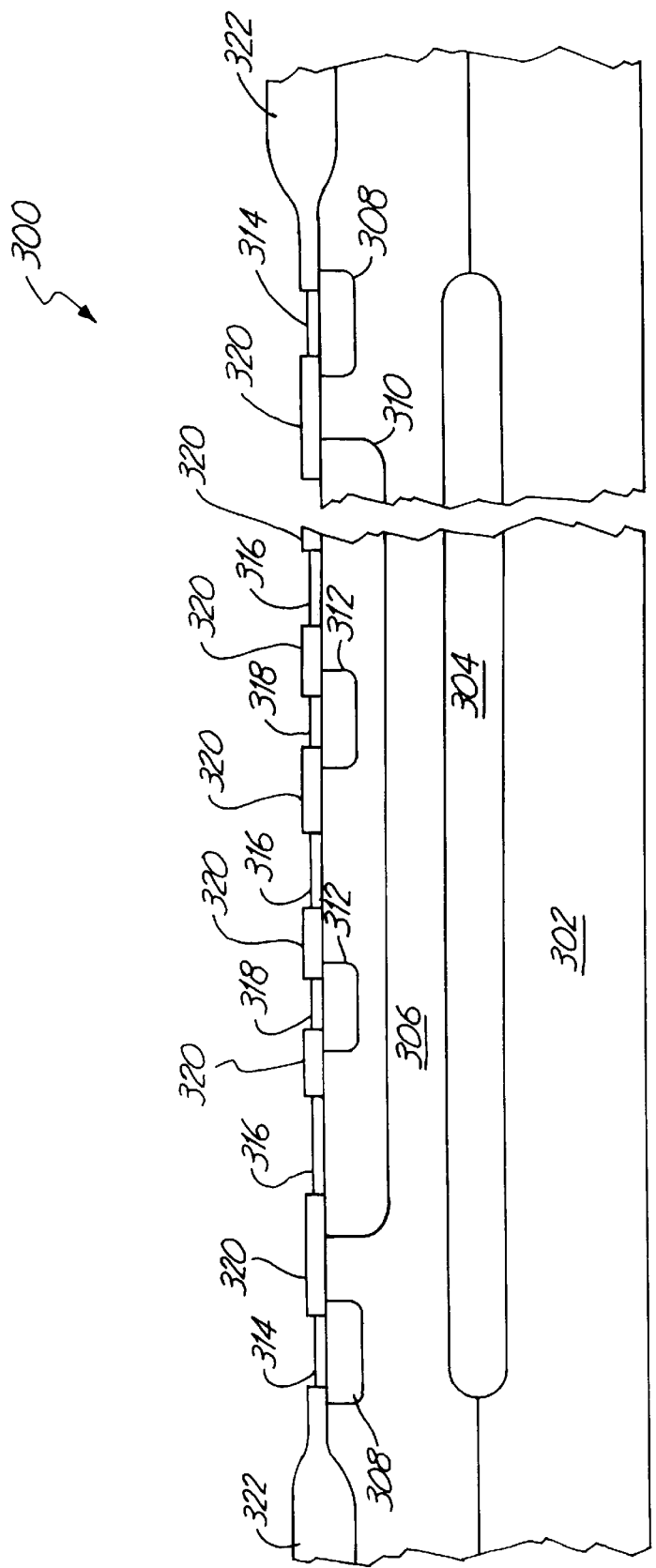
FIG. 3 is a layer diagram of a low noise transistor according to the present invention.
Figure 4:
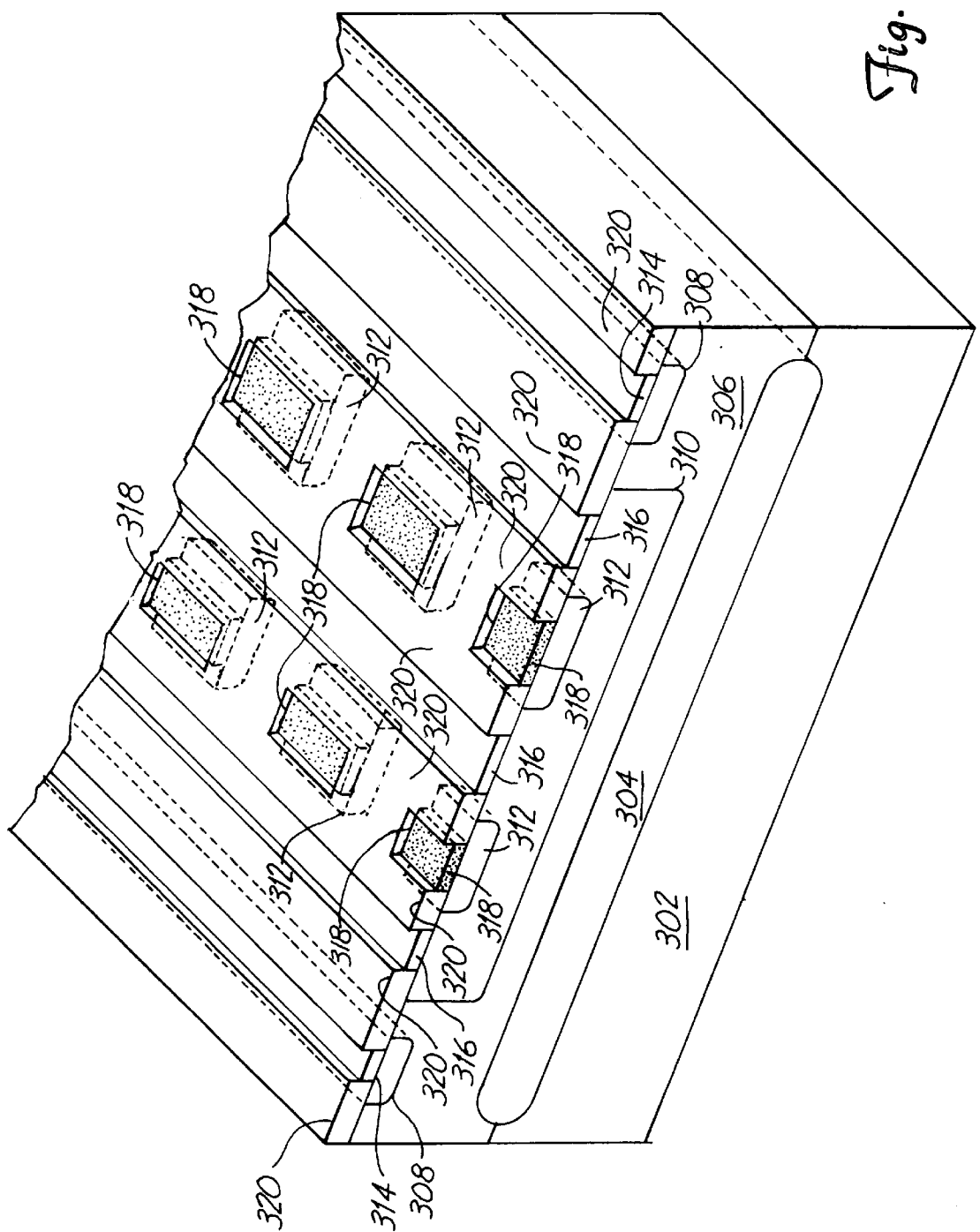
FIG. 4 is a perspective view of a low noise transistor according to the present invention.

FIG. 3 is a layer diagram, and FIG. 4 is a perspective view, showing the various layers of low noise transistor 300 fabricated according to the present invention. Transistor 300 is generally built from the bottom up. The foundation of transistor 300 is semiconductive substrate 302, such as a p-minus material. Buried collector layer 304, such as formed of a n-plus material, is positioned between substrate 302 and lightly doped collector region 306, formed of n-minus material by epitaxy or other means. Longitudinal collector contact regions 308 and longitudinal base region 310 are formed in parallel in epitaxial layer 306 of n-plus and p-minus materials, respectively. Several longitudinal emitter regions 312 are formed of n-plus material in parallel to collector contact regions 308 within base region 310. Emitter regions 312 are segmented along their length according to the present invention and look somewhat like rows of emitter "islands". Field oxide 322 separates the particular features of transistor 300 from any other structures that may be fabricated on the same substrate 302. Conductive collector contacts 314 are formed at least partially above collector contact regions 308. Rows of segmented conductive emitter contacts 318 are formed at least partially above respective rows of segmented emitter regions 312. Conductive base contacts 316 are formed at least partially above base region 310, some being positioned between and spaced from rows of emitter contacts 318 and others being positioned on the sides of base region 310 between and spaced from a row of emitter contacts 318 and a collector contact 314. Device oxide 320 is deposited over the top surface of transistor 300, and conductive collector contacts 314, base contacts 316. Emitter contacts 318 are formed at least partially through the device oxide 320.

The present invention is not limited to the precise layer configuration shown. For example, it is well known in the art to form a region of p-plus material in the area of the base region 310 underneath the location of base contacts 316, in order to slightly reduce the extrinsic base resistance through that region. Many different shapes of collector contacts 314, base contacts 316. and emitter contacts 318 can be implemented without affecting the applicability of the invention. The present invention is shown as applied to an NPN transistor configuration, but would be equally applicable to a PNP transistor configuration. The number of collector contact regions 308, base regions 310, and emitter regions 312 is also shown as an example only, and is not intended to limit the invention to any particular arrangement of a low noise transistor 300.

Figure 5:
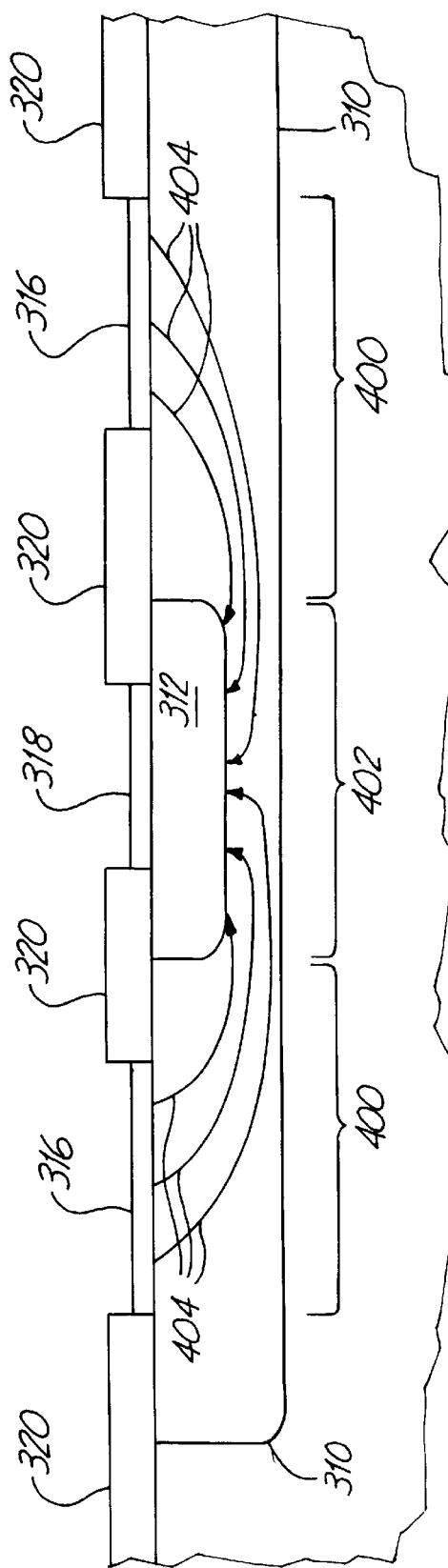
FIG. 5 is an enlarged fragmentary view of part of a low noise transistor as represented in the layer diagram of FIG. 3.

FIG. 5 is an enlarged fragmentary view of transistor 300 showing the operation of transistor 300 within base region 310 in greater detail. Arrows 404 represent the current flow within the base region from base contacts 316 to emitter region 312. The resistance associated with base region 310 located underneath emitter region 312 is the pinched base resistance, denoted by region 402. The resistance associated with the rest of the base region 310 is the extrinsic base resistance, denoted by region 400. Current flowing along arrows 404 passes through areas of extrinsic base resistance 400 and areas of pinched base resistance 402. By segmenting each emitter region 312, there is a greater area of extrinsic base resistance 400, and smaller area of pinched base resistance 402 than in the prior art. This is desirable because the resistance associated with a pinched base region 402 is generally much greater than the resistance associated with an extrinsic base region 400.

Figure 6:
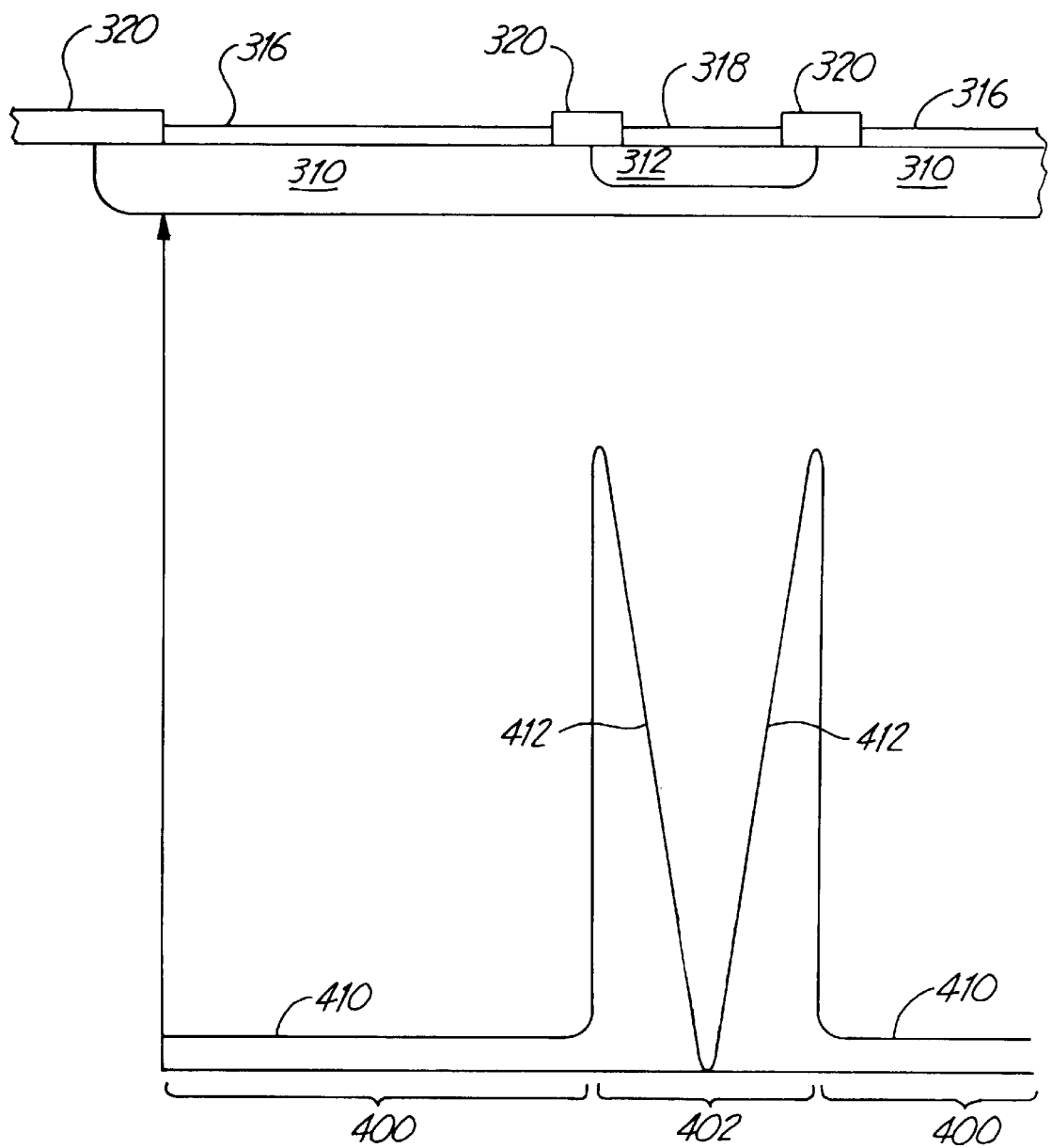
FIG. 6 is a graph setting forth the general characteristics of a low noise transistor according to the present invention.

FIG. 6 is a graph showing the relative noise resistance characteristics of various parts of base region 310. Lines 410 represent the extrinsic base resistance in regions 400 under base contact 316 and not under emitter region 312. Lines 412 represent the pinched base resistance in region 402 under emitter region 312. The pinched base resistance is zero at the center of emitter region 312 because the noise generated at the center of emitter region 312 is perfectly canceled by the left and right sides of emitter region 312 due to symmetry. Closer to the periphery of emitter region 312, there is less cancellation and a larger pinched base resistance results. By segmenting emitter regions 312 instead of implementing a continuous emitter stripe, the emitter regions are in parallel and the maximum pinched base resistance value at the periphery of the emitter region 312 is lower. The shape of the pinched base resistance characteristic 412 will continue to be downward sloping toward the center of the emitter region 312.

FIGS. 7–11 are top views of alternate embodiments of the present invention, showing implementation of different emitter to base contact ratios and layouts. The configurations of FIGS. 7–11 can be selectively implemented in a low noise transistor according to the present invention, depending on the pinched base resistance and extrinsic base resistance contributions to total transistor noise. As the ratio of emitter features to base contacts is increased, there is a limit where the pinched base resistance is reduced and the extrinsic base resistance is increased such that the extrinsic base resistance contributes to overall transistor noise more than pinched base resistance. Beyond this limit, total transistor noise will actually increase if more emitter features are packed into the transistor for each base contact. Thus, the optimum layout and emitter feature to base contact ratio should be selected to achieve the best low noise transistor performance.

Figure 7:
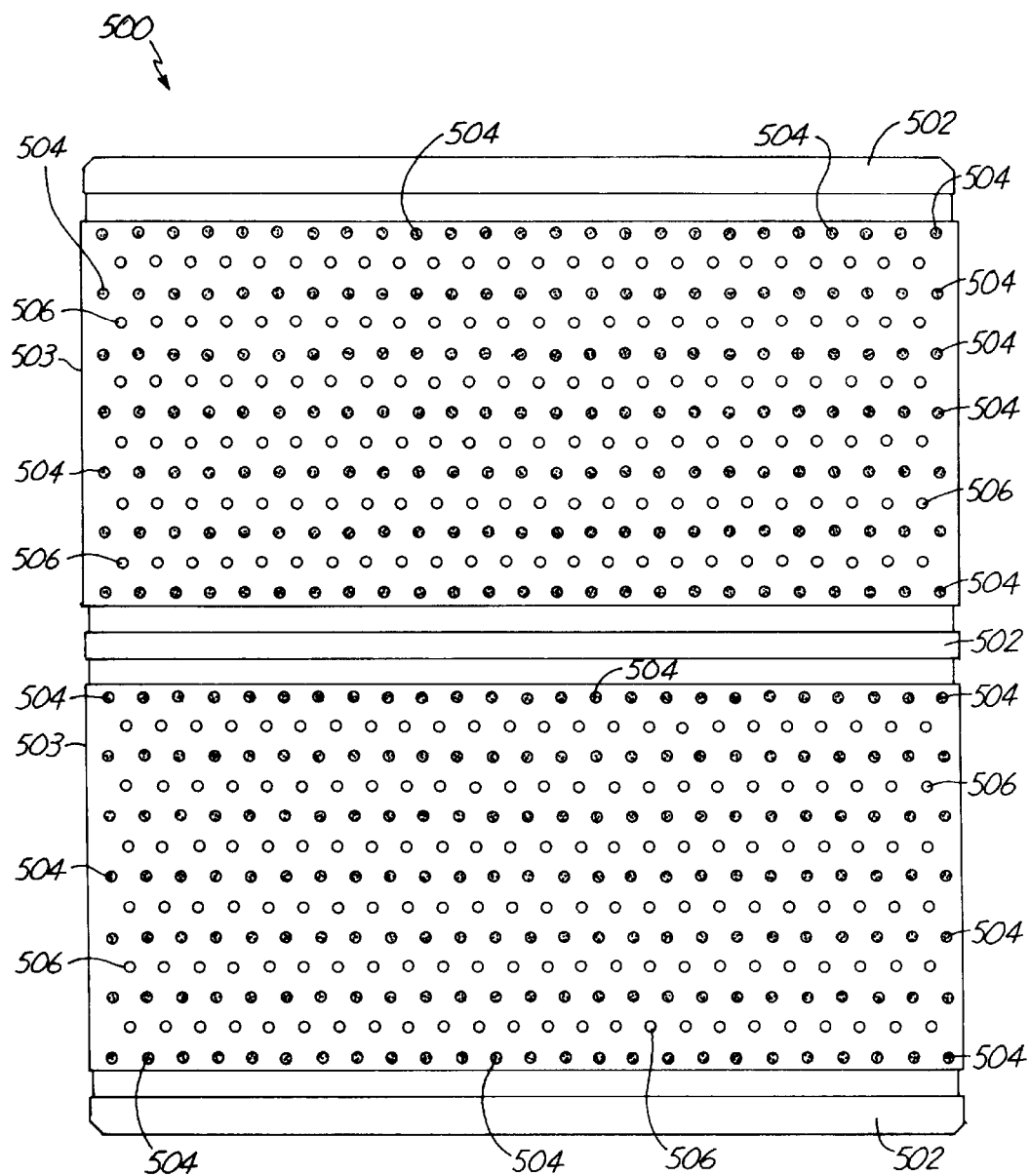
FIGS. 7–11 are top views of alternate embodiments of a low noise transistor according to the present invention.

With reference to FIG. 7, low noise transistor 500 is shown having collector contact regions 502, base regions 503, base contacts 504, and emitter features 506. Base contacts 504 and emitter features 506 are arranged in a hexagonal grid in order to maximize the packing density of the segmented features. Transistor 500 has one emitter feature dot 506 for each base contact dot 504.

Figure 8:
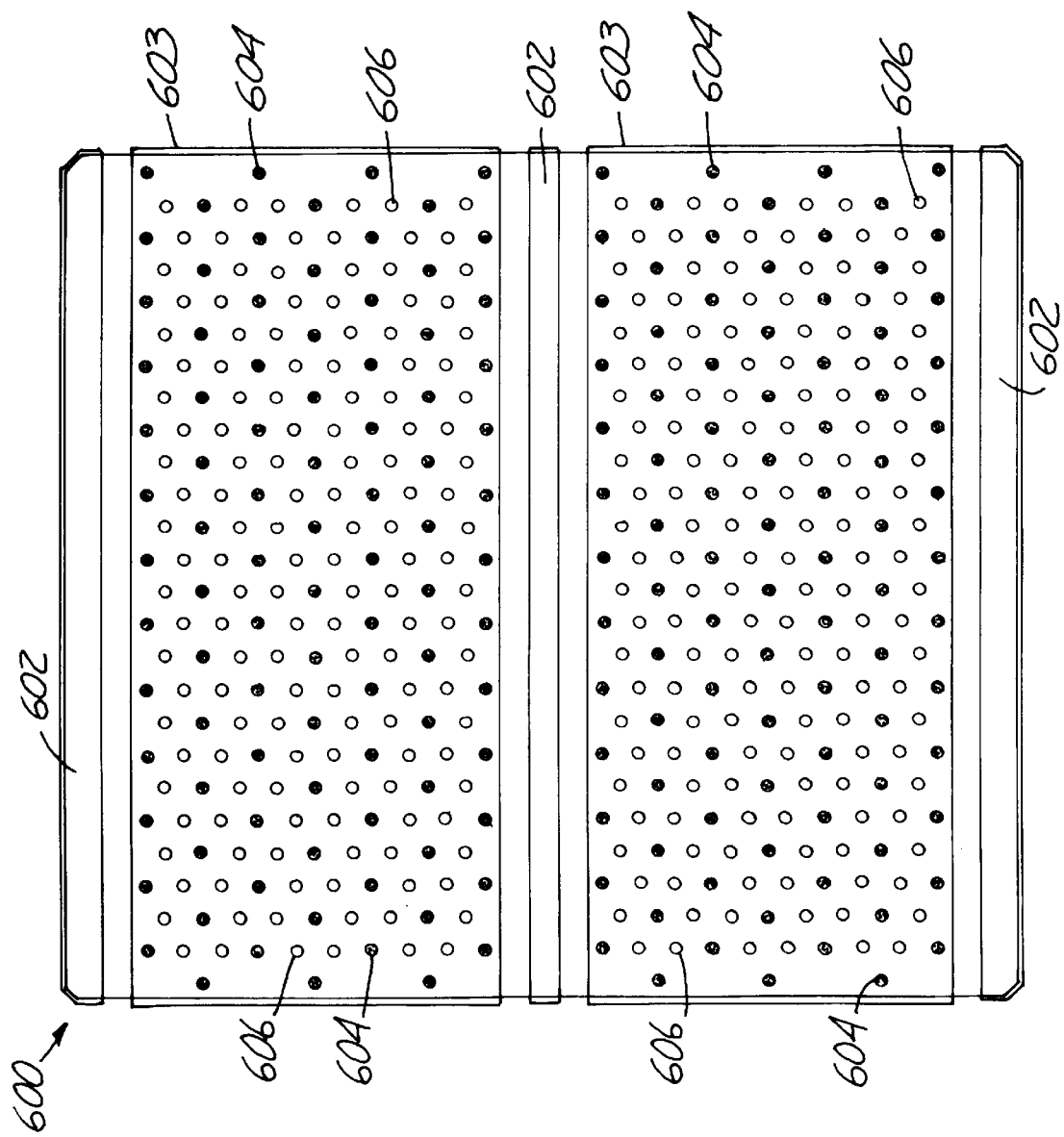

FIG. 8 shows low noise transistor 600 having collector contact regions 602, base regions 603, base contacts 604, and emitter features 606. Base contacts 604 and emitter features 606 are again laid out in a hexagonal grid. Transistor 600 has two emitter feature dots 606 for each base contact dot 604.

Figure 9:
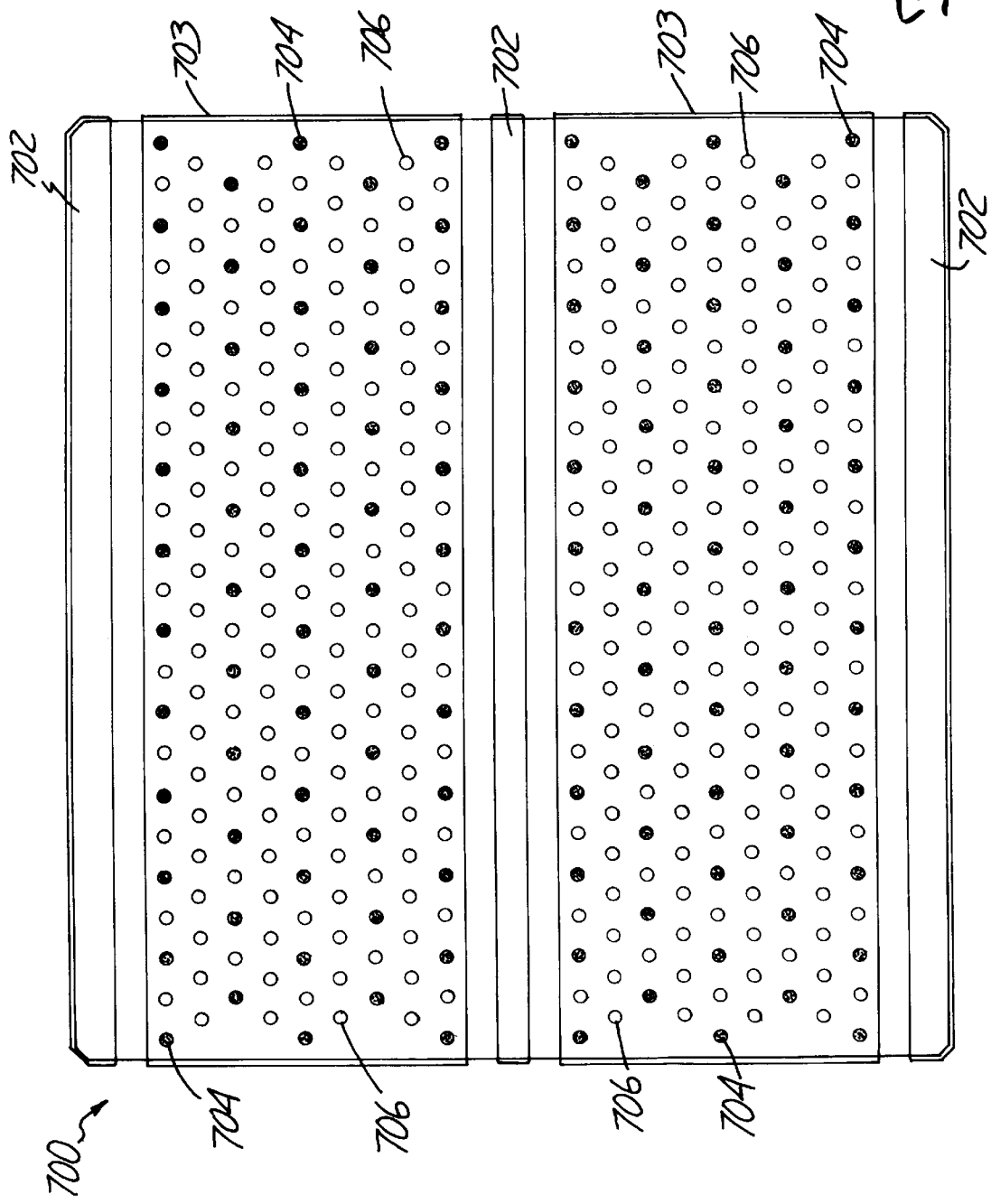

FIG. 9 shows low noise transistor 700 having collector contact regions 702, base regions 703, base contacts 704, and emitter features 706. Base contacts 704 and emitter features 706 are again laid out in a hexagonal grid. Transistor 700 has three emitter feature dots 706 for each base contact dot 704.

Figure 10:
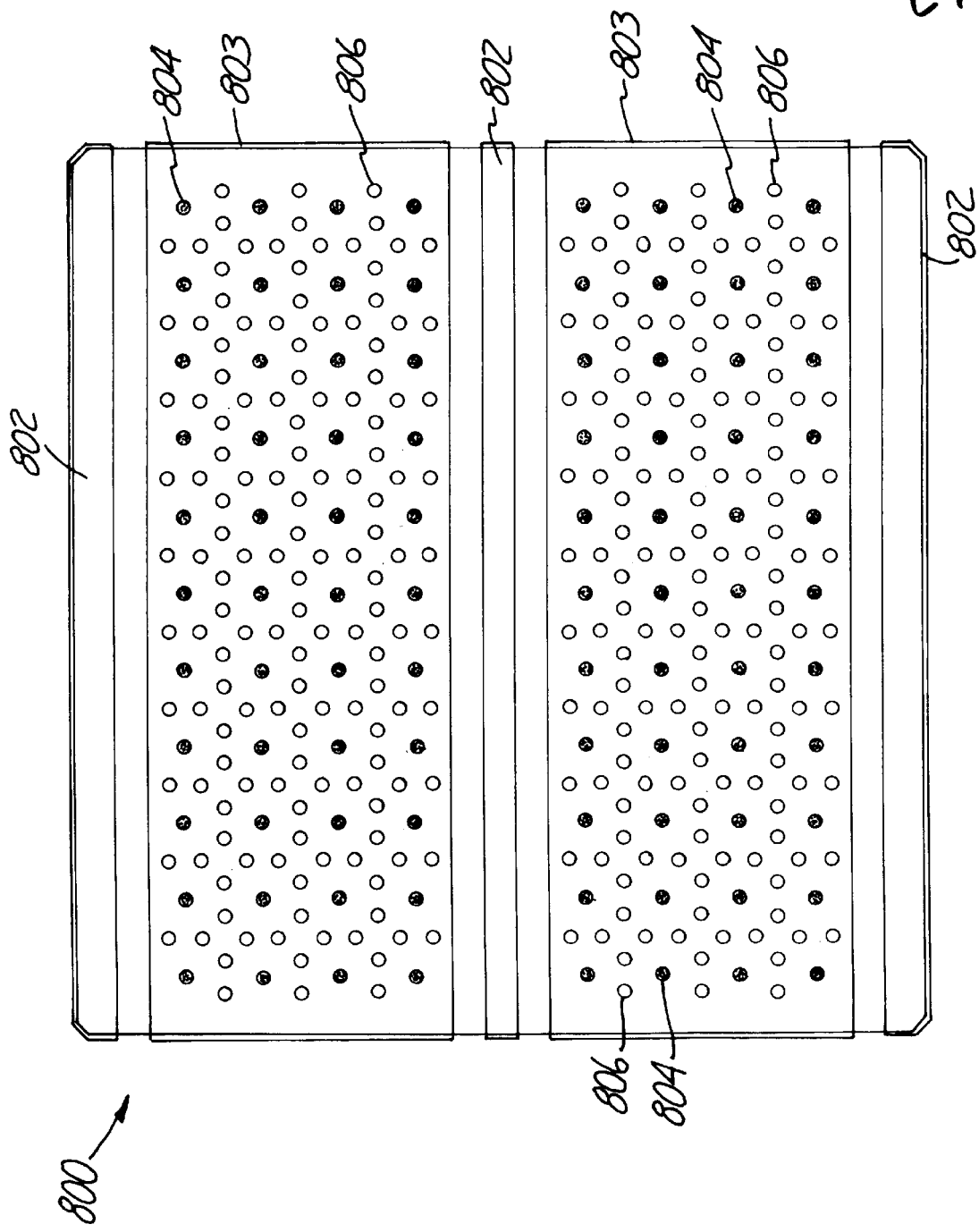

FIG. 10 shows low noise transistor 800 having collector contact regions 802, base regions 803, base contacts 804, and emitter features 804. Emitter features 806 octagonally surround each base contact dot 804, to allow a higher ratio of emitter features 806 to base contacts 804. Transistor 800 has four emitter feature dots 806 for each base contact dot 804.

Figure 11:
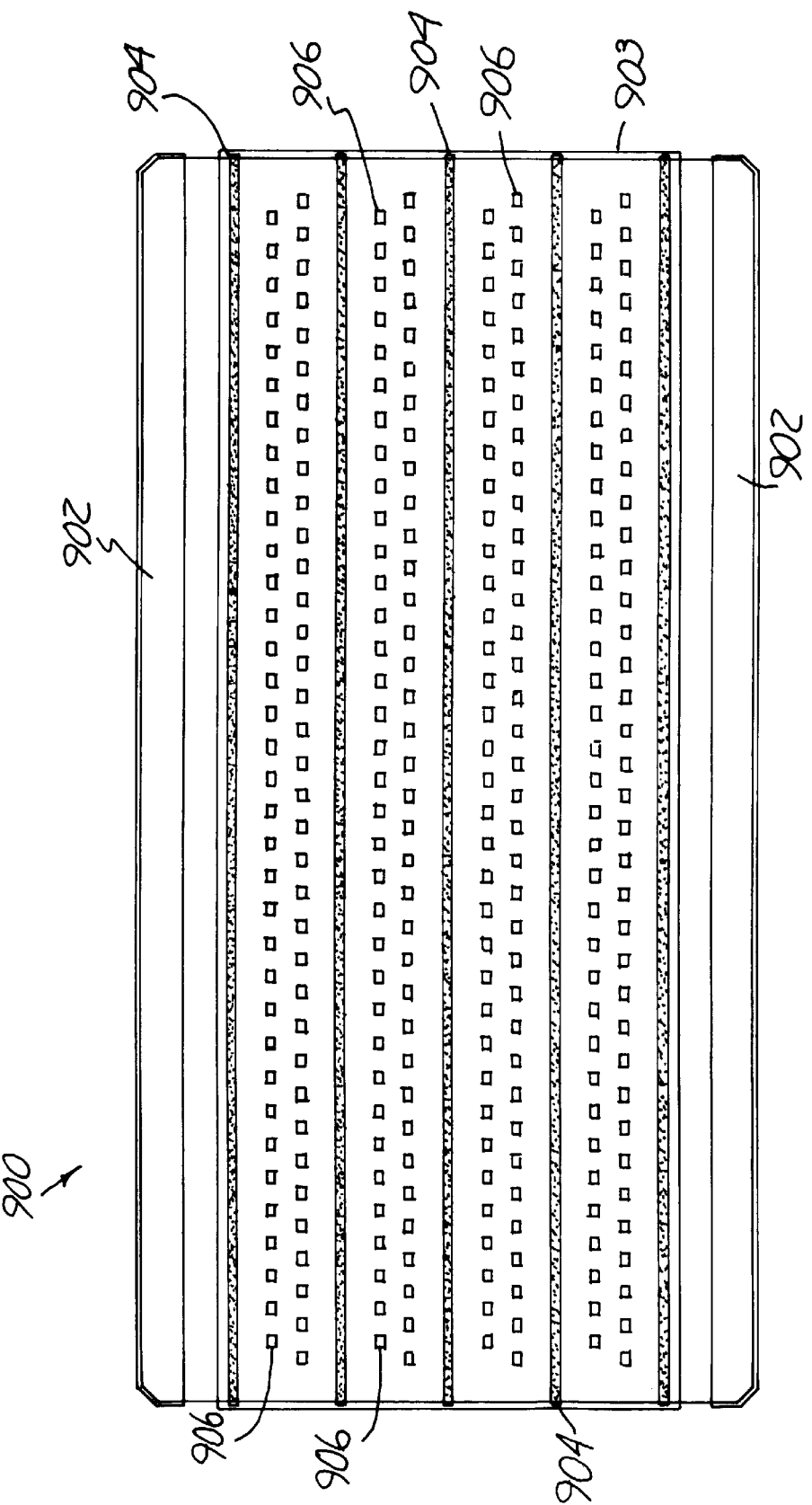

FIG. 11 shows low noise transistor 900 having collector contact regions 902, a base region 903, base contact stripes 904, and two rows of emitter features 906 between successive base contact stripes 904. Each base contact stripe 904 is associated with two rows of emitter feature dots 906. This is just another example of a different way to arrange emitter features 906 and base contacts 904.

Although the present invention has been described with reference to preferred embodiments, workers skilled in the art will recognize that chances may be made in form and detail without departing from the spirit and scope of the invention.

What is claimed is:

1. A method of fabricating an improved low noise transistor comprising:

fabricating a substrate;

forming a lightly doped collector region on the substrate;

forming a buried region of a first semiconductive material adjacent to the substrate and the lightly doped collector region;

forming at least one longitudinal collector contact region of the first semiconductive material solely within the lightly doped collector region;

forming at least one longitudinal base region of a second semiconductive material solely within the lightly doped collector region; and forming at least one longitudinal emitter region of the first semiconductive material solely within the base region, wherein each longitudinal emitter region of the at least one longitudinal emitter region consists of a plurality of segmented emitter features.

2. The method of claim 1 further comprising:

forming at least one conductive collector contact adjacent to the at least one longitudinal collector contact region;

forming a plurality of conductive base contacts adjacent to the at least one longitudinal base region; and forming a plurality of conductive emitter contacts adjacent to the plurality of segmented emitter features.

3. The method of claim 2 wherein the step of forming a plurality of conductive base contacts further comprises forming at least one row having a plurality of segmented conductive base contacts disposed adjacent to the at least one longitudinal base region.

4. The method of claim 1 wherein the steps of forming at least one longitudinal collector contact region, forming at least one longitudinal base region and forming at least one longitudinal emitter region further comprises diffusing the at least one longitudinal collector region, the at least one longitudinal base region and at least one emitter region through a layer of photoresistive material.

* * * * *